(12) United States Patent
Sai et al.

(10) Patent No.: US 7,449,961 B2
(45) Date of Patent: Nov. 11, 2008

(54) PARALLEL CONTROLLED CONNECTIONS OF THE PLURALITY OF RING OSCILLATOR UNITS, PLL, RADIO APPARATUS

(75) Inventors: Akihide Sai, Kawasaki (JP); Hidenori Okuni, Kawasaki (JP); Takafumi Yamaji, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 11/532,630

(22) Filed: Sep. 18, 2006

(65) Prior Publication Data
US 2007/0182493 A1  Aug. 9, 2007

(30) Foreign Application Priority Data
Feb. 3, 2006  (JP) ............................. 2006-026616

(51) Int. Cl.
*H03L 7/00*  (2006.01)
(52) U.S. Cl. ............................................. 331/2; 331/57

(58) Field of Classification Search ...................... 331/2, 331/56, 57
See application file for complete search history.

(56) References Cited

U.S. PATENT DOCUMENTS

2002/0003452 A1* 1/2002 Mizuno et al. ................. 331/2
2003/0185158 A1* 10/2003 Lucas et al. ................. 370/252
2004/0125008 A1 7/2004 Yamaji

FOREIGN PATENT DOCUMENTS

| CN | 1512671 | 12/2003 |
| EP | 1434354 | 6/2004 |
| JP | 11-088164 | 3/1999 |
| JP | 2004-364055 | 12/2004 |

* cited by examiner

*Primary Examiner*—Joseph Chang
(74) *Attorney, Agent, or Firm*—Amin, Turocy, Calvin, LLP

(57) ABSTRACT

An oscillator includes a plurality of oscillating units connected in parallel with each other, and a control unit which controls the number of parallel connections of the plurality of oscillating units based on an instruction signal indicating accuracy to be tolerated with respect to oscillation outputs of the oscillating units.

13 Claims, 4 Drawing Sheets

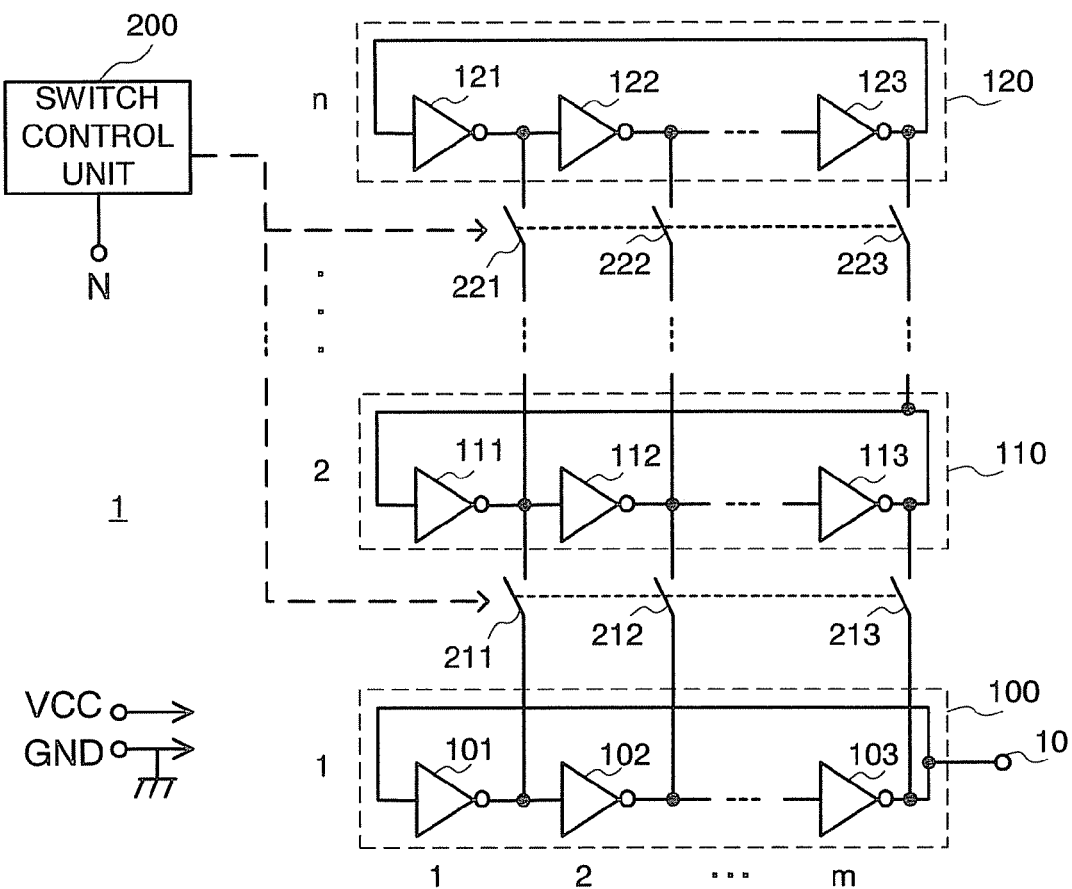
FIG. 1
FIG. 2
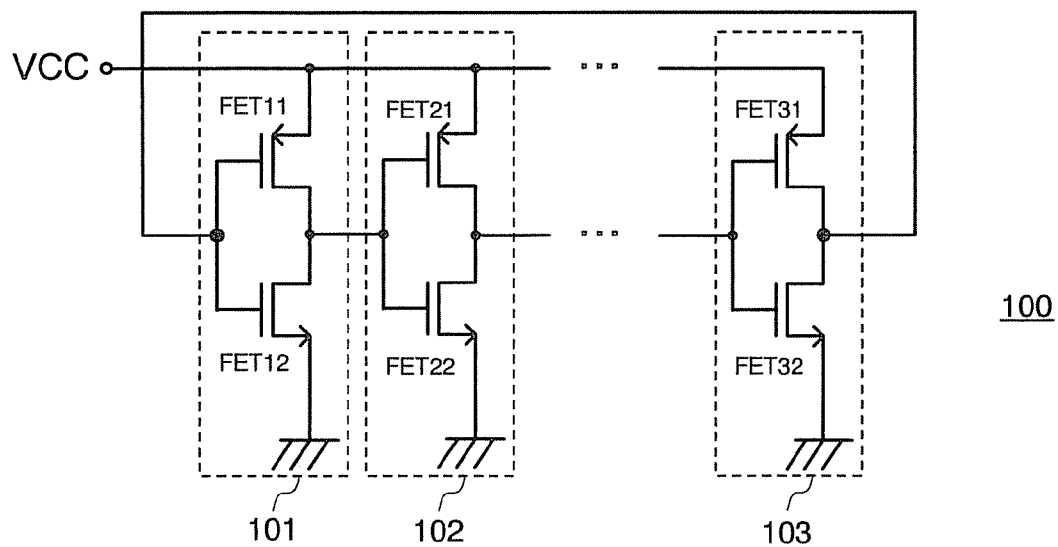

FIG. 7

| MODULATION METHOD | SIGNAL POWER [dBm] | NOISE POWER OF OTHER THAN A/D CONVERTER | NOISE POWER IN A/D CONVERTER | TOTAL NOISE POWER | SNR [dB] |
|---|---|---|---|---|---|
| BPSK | 10 | 2 | -20 | 2.03 | 8 |
| 16QAM | 20 | 2 | -20 | 2.03 | 18 |
| 16QAM (after adjusting amplituede) | 10 | -8 | -20 | -7.73 | 17.7 |

FIG. 8

| MODULATION METHOD | SIGNAL POWER [dBm] | NOISE POWER OF OTHER THAN A/D CONVERTER | NOISE POWER TOLERATED FOR A/D CONVERTER | TOTAL NOISE POWER | SNR [dB] |
|---|---|---|---|---|---|
| BPSK | 10 | 2 | -4 | 3 | 7 |
| 16QAM (after adjusting amplituede) | 10 | -8 | -14 | -7 | 17 |

PARALLEL CONTROLLED CONNECTIONS OF THE PLURALITY OF RING OSCILLATOR UNITS, PLL, RADIO APPARATUS

CROSS-REFERENCE TO RELATED APPLICATIONS

This application is based upon and claims the benefit of priority from the prior Japanese Patent Application No. 2006-026616, filed on Feb. 3, 2006; the entire contents of which are incorporated herein by reference.

BACKGROUND

1. Field of the Invention

The present invention relates to an oscillator such as a voltage controlled oscillator for example, and particularly relates to an oscillator, a PLL oscillator, a radio apparatus suitable for a radio communication apparatus capable of using plural communication methods.

2. Description of the Related Art

For radio apparatuses, mobile radio apparatuses in particular, decreasing power consumption is one of major issues. For digital radio apparatuses, which are becoming common recently, decreasing power consumption of an analog part thereof contributes largely to decreasing power consumption of an entire radio apparatus.

Incidentally, as a digital radio apparatus, one adopting a method to switch not only transmission power but also a modulation method depending on a propagation environment is known. For example, IEEE 802.11a, which is one of wireless LAN standards, defines to use a modulation method which has high frequency utilization efficiency and is capable of high speed transmission, such as 16 QAM or 64 QAM, in an environment where few noises and interference signals exist and use a modulation method which has a slow transmission speed but has a wide signal point interval and is less affected by noises and interferences, such as QPSK, in an environment where many noises and interferences exist.

As a local oscillator of an orthogonal modulator-demodulator or a clock signal source for an ADC (A/D converter) in such a radio apparatus, normally a PLL (Phase Locked Loop) is used. In a radio apparatus with a variable modulation method in which a modulation method switches, a tolerable noise level varies according to a modulation method used, and therefore accuracy required for the PLL varies accordingly.

Here, the accuracy of the PLL means a phase noise level, and mainly, it is often expressed as a phase noise spectrum on a frequency axis in the local oscillator, and as a jitter on a time axis in the clock signal source for an ADC. For example, when a modulation method which has high frequency utilization efficiency, high accuracy is required also in the orthogonal modulator-demodulator and in the ADC, so that the phase noise level of the PLL needs to be lowered accordingly. On the other hand, when a modulation method which is strong to noise is used, the phase noise can be tolerated to a certain level, and thus power consumption of the PLL can be decreased.

PLLs capable of controlling the phase noise level are disclosed in, for example, JP-A 2004-364055 (KOKAI) (hereinafter referred to as "Document 1") and in JP-A11-88164 (KOKAI) (hereinafter referred to as "Document 2"). Document 1 is a technique related to a PLL capable of using with plural communication methods, which is specifically for selecting from plural loop filters having different time constants an optimum one according to an oscillation frequency band of a VCO (voltage controlled oscillator). Thus, it is possible to optimize the phase noise level of the PLL for plural communication methods having different tolerable noise levels and frequency bands.

Further, in Document 2, the clock signal frequency of a decimal division control unit in a fractional synthesizer is changed according to a modulation method so as to optimize power consumption. This synthesizer performs decimal division control by means of a clock signal obtained by dividing a reference signal, and changes the frequency of a control clock by changing a dividing ratio for the reference signal. Accordingly, a loop gain of the PLL changes, so that the phase noise level can be controlled.

However, the method described in Document 1 is for optimizing the phase noise level for plural communication methods and is not capable of optimizing power consumption. Also, the loop filter is constituted of passive elements such as capacitors, and thus there arises a problem of increasing costs when plural filters are included.

Also, the method in Document 2 allows optimization of power consumption according to a modification method, but since most of power consumption in a PLL is consumed in an analog part such as a VCO, significant reduction effect in power consumption cannot be expected.

As described above, there is a problem in conventional oscillators, PLL oscillators and radio apparatuses such that the optimization of power consumption according to a modulation method or a propagation environment cannot be performed.

SUMMARY

An oscillator according to one aspect of the present invention include a plurality of oscillating units connected in parallel with each other, and a control unit which controls the number of parallel connections of the plurality of oscillating units based on an instruction signal indicating accuracy to be tolerated with respect to oscillation outputs of the oscillating units. Further, the oscillator may further include an operation stop unit which stops an operation of an oscillating unit which is excluded from the parallel connection by the control unit.

Further, a PLL oscillator according to another aspect of the present invention includes a voltage controlled oscillator including a plurality of oscillating units connected in parallel with each other and a control unit which controls the number of parallel connections of the plurality of oscillating units based on an instruction signal indicating accuracy to be tolerated with respect to oscillation outputs of the oscillating units, a reference signal oscillator, a phase comparator which compares a phase of an output of the voltage controlled oscillator and a phase of an output of the reference signal oscillator, and a loop filter which generates a controlled voltage for controlling the voltage controlled oscillator based on a phase comparison result by the phase comparator.

Further, a radio apparatus according to another aspect of the present invention includes an A/D (analog/digital) converter which A/D converts a received signal, an oscillator including a plurality of oscillating units connected in parallel with each other and a control unit which controls the number of parallel connections of the plurality of oscillating units based on an instruction signal indicating accuracy to be tolerated with respect to oscillation outputs of the oscillating units, and supplying a clock signal to the A/D converter, and a signal processing unit which demodulates the A/D converted received signal and outputs the instruction signal to the oscillator according to a modulation method of the received signal.

BRIEF DESCRIPTION OF THE DRAWINGS

FIG. 1 is a block diagram showing the structure of a VCO according to a first embodiment of the present invention.

FIG. 2 is an equivalent circuit diagram showing the fundamental structure of a ring oscillating unit of the first embodiment.

FIG. 7 is a table explaining SNRs of BPSK and 16 QAM.

FIG. 8 is a table explaining tolerable amounts of noise power generated by an A/D converter.

DETAILED DESCRIPTION

Figure 3:
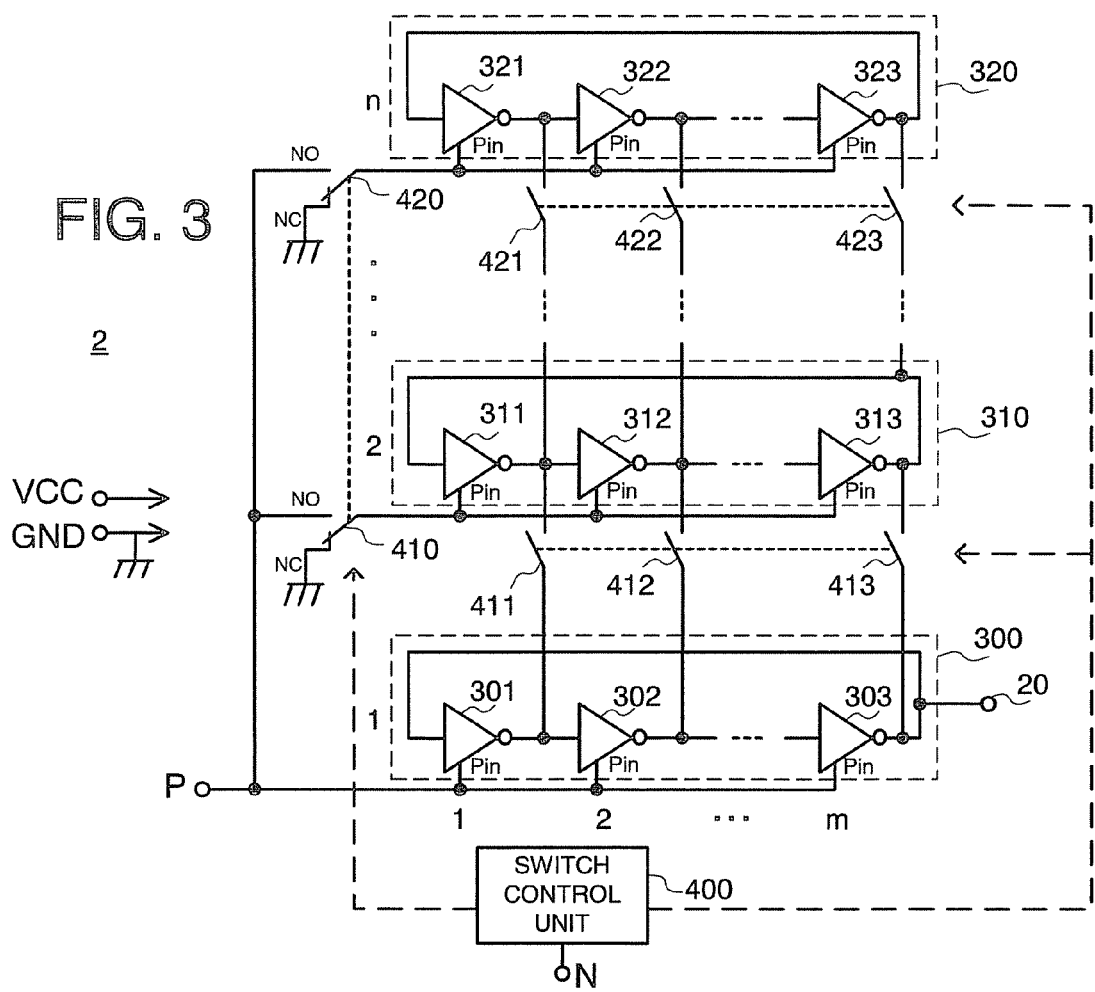
FIG. 3 is a block diagram showing the structure of a VCO according to a second embodiment of the present invention.

In embodiments of the present invention which will be described below, optimization control of power consumption of an oscillator (VCO) corresponding to required accuracy (noise level) is realized As the VCO, generally there are two types, an LC type and a ring type, which are selected and used depending on an application The LC type has a high oscillation frequency band and excellent phase noise characteristics, but increases the scale of a circuit due to passive elements On the other hand, the ring type has lesser phase noise characteristics than the LC type, but it allows to lower costs and dimensions In this embodiment, the ring type VCO is used to realize the optimization control of power consumption.

Hereinafter, an embodiment of the present invention will be described in detail with reference to the drawings. As shown in FIG. 1, an oscillator 1 according to this embodiment has a structure in which n number (n is integer) of ring oscillating units are connected in parallel, each of which is constituted of an inverter chain formed by connecting m number (m is odd number) of inverters in series. Output terminals of inverters constituting each inverter chain are connected in parallel to output terminals of corresponding inverters respectively in an adjacent inverter chain via m rows of switches. Here, the number m of inverters constituting a ring oscillating unit may be approximately few tens to one hundred and the number n of ring oscillating units may be approximately few tens to few hundreds, but for simplification of explanation, the following description is given with the number of ring oscillating units being 3 and the number of inverters of a ring oscillating unit being 3 (m=n=3).

Specifically, the oscillator 1 of this embodiment includes a ring oscillating unit 100 formed by connecting inverters 101 to 103 in series, a ring oscillating unit 110 formed similarly by connecting inverters 111 to 113 in series, and a ring oscillating unit 120 formed similarly by connecting inverters 121 to 123 in series.

In the ring oscillating unit 100, the input (input path) of the inverter 102 is connected to the output (output path) of the inverter 101, the input of the inverter 103 is connected to the output of the inverter 102, and the input of the inverter 101 is connected to the output of the inverter 103, which thereby form one loop, constituting a ring oscillator as a whole. Then, to the output of the inverter 103, an output terminal 10 is further connected which outputs an oscillator signal of the ring oscillating unit 100.

The inverters 101 to 103 are logic elements each constituted of a so-called NOT circuit, having a function to invert an input and then output it. Specifically, it outputs a Lo level (ground level) when an input is Hi level (power supply voltage level), and outputs a Hi level when an input is Lo level. The inverters 101 to 103 are realized as an integrated circuit including a large number of inverters.

The ring oscillating unit 110 and the ring oscillating unit 120 have a structure in common with the ring oscillating unit 100, forming inverter chains constituted of the inverters 111 to 113 and inverters 121 to 123 connected in series, respectively. However, the ring oscillating unit 110 and the ring oscillating unit 120 do not have an independent output terminal. The ring oscillating units 100 to 120 each function independently as a ring oscillator with a substantially common performance.

The ring oscillating unit 100 is connected in parallel to the ring oscillating unit 110 via switches 211 to 213, and the ring oscillating unit 110 is connected in parallel to the ring oscillating unit 120 via switches 221 to 223. Specifically, to the respective outputs (respective output paths) of the inverters 101 to 103 constituting the ring oscillating unit 100, one ends of the switches 211 to 213 are connected respectively. Further, to the respective outputs of the inverters 111 to 113 (the output paths of the inverters 111 to 113 of stages corresponding to the inverters 101 to 103 respectively) constituting the ring oscillating unit 110, the other ends of the switches 211 to 213 are connected respectively. Similarly, to the respective outputs of the inverters 111 to 113 constituting the ring oscillating unit 110, one ends of the switches 221 to 223 are connected respectively. Further, to the respective outputs of the inverters 121 to 123 constituting the ring oscillating unit 120, the other ends of the switches 221 to 223 are connected respectively.

The switches 211 to 213 are switch units which open/close in conjunction with each other. Similarly, the switches 221 to 223 open/close in conjunction with each other. In other words, the switches 211 to 213 and 221 to 223 in this embodiment each have a function to simultaneously turn on/off the connection between respective inverters of respective corresponding stages of adjacent ring oscillating units so as to turn on/off the parallel connection of the ring oscillating units 100 to 120.

The switches 211 to 213 and the switches 221 to 223 are each connected to a switch control unit 200. Based on an instruction signal indicating accuracy required for the oscillator 1, which is inputted to its accuracy instruction terminal N, the switch control unit 200 controls opening/closing of the switches 211 to 213 and the switches 221 to 223. By opening/closing the switches 211 to 213 and the switches 221 to 223, the number of parallel connections of the ring oscillating units 100 to 120 is increased/decreased, thereby controlling the accuracy of an oscillation signal of the entire oscillator 1 outputted to the output terminal 10. Specifically, the switch control unit 200 has a parallel connection control function for the ring oscillating units, along with the switches 211 to 213 and the switches 221 to 223.

Here, referring to FIG. 2, control of accuracy of an oscillation signal of the oscillator 1 will be described in detail. As shown in FIG. 2, the inverters 101 to 103 constituting the ring oscillating unit 100 are each constituted of a NOT circuit formed by combining a pair of FETs. Specifically, the inverter 101 has a p-channel FET 11 (PMOS transistor) whose source is connected to the power supply, an n-channel FET 12

(NMOS transistor) whose source is connected to the ground. Gates of the FETs 11 and 12 are connected together to form the input of the inverter 101, and similarly drains thereof are connected together to form the output of the inverter 101. The inverter 102 and the inverter 103 have a structure in common with the inverter 101, forming NOT circuits constituted of a pair of FET 21 and FET 22 and a pair of FET 31 and FET 32, respectively.

The drains of the FET 11 and FET 12 connected together, namely, the output of the inverter 101 is connected to gates of the FET 21 and FET 22 connected together, namely the input of the inverter 102. Similarly, drains of the FET 21 and FET 22 and gates of the FET 31 and FET 32 are connected. Drains of the FET 31 and FET 32 connected together, namely, the output of the inverter 103 is connected to the input of the inverter 101, thereby forming a ring oscillator.

Here, a phase noise in the ring oscillating unit 100 occurs mainly due to a thermal noise generated by channel resistance of a transistor The thermal noise generated by channel resistance is expressed by the following equation.

$$Vn^2 = 4kTR\Delta f \qquad \text{Equation 1}$$

Here, k is a Boltzmann's constant, T is an absolute temperature and R is channel resistance. It can be seen from Equation 1 that the phase noise level and the channel resistance of the ring oscillator are in a proportional relation.

In the oscillator 1 shown in FIG. 1, by turning on/off the switches 211 to 213 and the switches 221 to 223, the number of parallel connections between the ring oscillating units 100 to 120 is controlled. For example, when the switch control unit 200 turns only the switches 211 to 213 on, the output terminals of the inverters 101 to 103 are connected to the output terminals of the inverters 111 to 113 respectively, and an oscillator signal of the ring oscillating unit 100 and an oscillator signal of the ring oscillating unit 110 synchronize with each other.

At this time, the number of parallel connections of the ring oscillating units constituting the oscillator 1 changes from 1 to 2, and the channel resistance of the transistors constituting the inverters becomes half. Therefore, according to Equation 1, the phase noise level of the entire oscillator 1 decreases by 3 dB. Further, when the switch control unit 200 turns the switches 221 to 223 on in addition to the switches 211 to 213 to change the number of parallel connections to 3, the channel resistance of the transistors constituting the inverters becomes ⅓ and the phase noise level lowers by 4.7 dB. Similarly, when the number of parallel connections of the ring oscillating units is changed to 10, the channel resistance becomes 1/10 and the phase noise level decreases by 10 dB.

As described above, according to the oscillator 1 of this embodiment, since the switches 211 to 213 and 221 to 223 are provided for connecting the ring oscillating units 100 to 120 in parallel and turning on/off between the ring oscillating units, and the number of parallel connections is controllable by the switch control unit 200, the phase noise level of the entire oscillating unit 1 can be controlled by sequentially turning on the group of switches as necessary. Note that the oscillation frequency of the ring oscillator does not depend on channel widths of the transistors, so that the oscillation frequency of the oscillator 1 will not be changed by turning on/off of the switches for connecting the ring oscillating units 100 to 120 in parallel.

Next, referring to FIG. 3, an oscillator according to the second embodiment of the present invention will be described in detail. The oscillator of this embodiment further includes switch units which turn on/off oscillations of the ring oscillating units, in addition to the structure of the oscillator according to the first embodiment.

As shown in FIG. 3, similarly to the oscillator according to the first embodiment, an oscillator 2 according to this embodiment has a structure in which n number (n is integer) of ring oscillating units are connected in parallel, each of which is constituted of an inverter chain formed by connecting m number (m is odd number) of inverters in series. Output terminals of inverters constituting each inverter chain are connected in parallel to output terminals of corresponding inverters respectively in an adjacent inverter chain via m rows of switches. Similarly to the first embodiment, the number m of inverters constituting a ring oscillating unit may be approximately few tens to one hundred and the number n of ring oscillating units may be approximately few tens to few hundreds, but for simplification of explanation, the following description is given with the number of ring oscillating units being 3 and the number of inverters of a ring oscillating unit being 3 (m=n=3).

Specifically, the oscillator 2 includes a ring oscillating unit 300 formed by connecting inverters 301 to 303 in series, a ring oscillating unit 310 formed similarly by connecting inverters 311 to 313 in series, and a ring oscillating unit 320 formed similarly by connecting inverters 321 to 323 in series. Here, the ring oscillating units 300 to 320 and the inverters 301 to 303, 311 to 313, 321 to 323 correspond respectively to the ring oscillating units 100 to 120 and the inverters 101 to 103, 111 to 113, 121 to 123 in the first embodiment, and the structures thereof are in common therewith, so that redundant explanations are omitted.

The ring oscillating unit 300 is connected in parallel to the ring oscillating unit 310 via switches 411 to 413, and the ring oscillating unit 310 is connected in parallel to the ring oscillating unit 320 via switches 421 to 423. Specifically, to the respective outputs of the inverters 301 to 303 constituting the ring oscillating unit 300, one ends of the switches 411 to 413 are connected respectively. Further, to the respective outputs of the inverters 311 to 313 constituting the ring oscillating unit 310, the other ends of the switches 411 to 413 are connected respectively. Similarly, to the respective outputs of the inverters 311 to 313 constituting the ring oscillating unit 310, one ends of the switches 421 to 423 are connected respectively. Further, to the respective outputs of the inverters 321 to 323 constituting the ring oscillating unit 320, the other ends of the switches 421 to 423 are connected respectively.

The switches 411 to 413 are switch units which open/close in conjunction with each other. Similarly, the switches 421 to 423 open/close in conjunction with each other. In other words, similarly to the first embodiment, also in the second embodiment the switches 411 to 413 and 421 to 423 each have a function to simultaneously turn on/off the connection between respective inverters of adjacent ring oscillating units so as to turn on/off the parallel connection of the ring oscillating units 300 to 320.

Moreover, in the oscillator 2 of this embodiment, the inverters 301 to 303, 311 to 313 and 321 to 323 constituting the ring oscillating units 300 to 320 have, in addition to the input terminals and the output terminals of the respective inverters, control terminals $P_{in}$ for controlling an oscillation frequency of each of the ring oscillating units 300 to 320. Specifically, the control terminals $P_{in}$ of the respective inverters 301 to 303 which control the oscillation frequency of the ring oscillating unit 300 are connected with each other and to a frequency control terminal P of the oscillator 2. The control terminals $P_{in}$ of the respective inverters 311 to 313 which control the oscillation frequency of the ring oscillating unit 310 are connected with each other and to the frequency control terminal P via a switch 410. Similarly, the control terminals $P_{in}$ of the respective inverters 321 to 323 which control the oscillation frequency of the ring oscillating unit 320 are connected with each other and to the frequency control terminal P via a switch 420.

To the control terminals $P_{in}$ provided in the respective inverters, a control voltage supplied from the frequency control terminal P is applied. When the control voltage applied to the control terminals $P_{in}$ of inverters is zero (when it is ground level), the ring oscillating unit constituted by these inverters stops its oscillation. In other words, the ring oscillating units 300 to 320 function as a voltage controlled oscillator (VCO).

The switch 410 is a switch unit which performs switching in conjunction with the switches 411 to 413 and has a common terminal (COM terminal), a normally closed terminal (NC terminal) and a normally opened terminal (NO terminal) Similarly, the switch 420 is a switch unit which performs switching in conjunction with the switches 421 to 423 and has a structure in common with the switch 410. In the following description of the switches 410 and 420, a state that the common terminal and the NO terminal are connected will be referred to as "on", and a state that the common terminal and the NC terminal are connected will be referred to as "off".

The common terminals of the switches 410 and 420 are connected to the control terminals $P_{in}$ of the inverters 311 to 313 and 321 to 323. Also, the NC terminals thereof are connected to the ground, and the NO terminals thereof are connected to the frequency control terminal P. To the frequency control terminal P, a control voltage for frequency control is applied, and by turning on/off the switches 410 and 420, operation frequencies of the respective inverters are controlled.

Specifically, in a state that the switch 410 is on, the control voltage applied to the frequency control terminal P is applied to the control terminals $P_{in}$ of the inverters 311 to 313 constituting the ring oscillating unit 310. As a result, the inverters 311 to 313 change to an operating state, and thus the ring oscillating unit 310 changes to an oscillating state. Similarly, in a state that the switch 420 is on, the control voltage applied to the frequency control terminal P is applied to the control terminals $P_{in}$ of the inverters 321 to 323 constituting the ring oscillating unit 320. Then the inverters 321 to 323 change to an operating state, and thus the ring oscillating unit 320 changes to an oscillating state. On the other hand, in a state that the switches 410 and 420 are off, oscillations of the ring oscillating units 310 and 320 stop respectively.

The switches 410 to 413 and 420 to 423 are each connected to a switch control unit 400. Based on an instruction signal indicating accuracy required for the oscillator 2, which is inputted to its accuracy instruction terminal N, the switch control unit 400 controls turning on/off of the switches 410 to 413 and the switches 420 to 423. By turning on/off the switches 411 to 413 and the switches 421 to 423, the number of parallel connections of the ring oscillating units 300 to 320 is increased/decreased, thereby controlling the accuracy of an oscillation signal of the entire oscillator 2 outputted to an output terminal 20. Moreover, by turning on/off the switch 410 and the switch 420 (whether the control terminals $P_{in}$ of the inverters are connected to the frequency control terminal P or to the ground), the frequency and the operating state (operating or stopped) of the ring oscillating unit 310 and the ring oscillating unit 320 are controlled. In other words, the switch control unit 400 has a function as an operation stop unit which stops an operation of a ring oscillating unit which is excluded from the parallel connection.

Therefore, the accuracy of an oscillation signal of the entire oscillator 2 is controlled by increasing/decreasing the number of parallel connections of the ring oscillating units. Moreover, the ring oscillating unit 300 as the main ring oscillating unit is kept in an operating state by constantly connecting the control terminals $P_{in}$ of its inverters to the frequency control terminal P, and the operation of a ring oscillating unit which is not in a parallel connection state is stopped at all times, thereby enabling fine-tuned optimization of power consumption of the entire oscillator 2 while stabilizing the oscillation signal of the oscillator 2.

Here, referring to FIG. 4, control of power consumption of the oscillator 2 will be described in detail. Note that the control of accuracy of the oscillator 2 is the same as that for the oscillator 1 of the first embodiment, and thus redundant descriptions are omitted.

Figure 4:
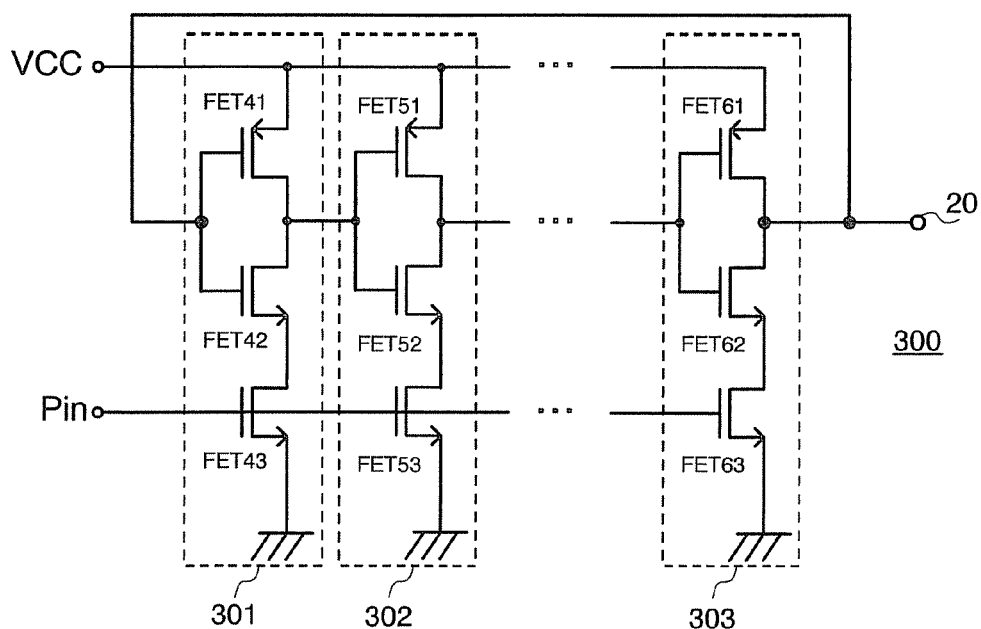
FIG. 4 is an equivalent circuit diagram showing the fundamental structure of a ring oscillating unit of the second embodiment.

As shown in FIG. 4, the inverters 301 to 303 constituting the ring oscillating unit 300 are each constituted of a NOT circuit formed by combining a group of FETs. Specifically, the inverter 301 has a p-channel FET 41 (PMOS transistor) whose source is connected to the power supply, an n-channel FET 43 (NMOS transistor) whose source is connected to the ground, and an n-channel FET 42 whose source is connected to the drain of the FET 43 and whose drain is connected to the drain of the FET 41.

Gates of the FETs 41 and 42 are connected together to form the input of the inverter 301, and similarly drains thereof are connected together to form the output of the inverter 301. Further, the gate of the FET 43 forms a control terminal $P_{in}$ of the inverter 301 and is connected to the frequency control terminal P.

Among the FETs constituting the inverter 301, the FETs 41 and 42 are paired to form a NOT circuit. Further, the FET 43 functions as a variable resistor controlled by a gate voltage applied to the control terminal $P_{in}$, and acts to control a resistance value between the source of the FET 42 and the ground.

The inverter 302 and the inverter 303 both have a structure in common with the inverter 301, constituted of NOT circuits formed of groups of FETs 51 to 53 and FETs 61 to 63, respectively.

The drains of the FET 41 and FET 42 connected together, namely the output of the inverter 301 is connected to gates of the FET 51 and FET 52 connected together, namely the input of the inverter 302. Similarly, drains of the FET 51 and FET 52 and gates of the FET 61 and FET 62 are connected. Drains of the FET 61 and FET 62 connected together, namely, the output of the inverter 303 is connected to the input of the inverter 301.

The gate of the FET 43, namely the control terminal $P_{in}$ of the inverter 301 is connected to the gate of the FET 53 and the gate of the FET 63. Specifically, by a voltage value of a control voltage to the control terminal $P_{in}$, operating states of the inverters 301 to 303 are controlled to be the same state simultaneously.

In the ring oscillating unit 300 shown in FIG. 4, when a predetermined control voltage is applied to the control terminal $P_{in}$, the FETs 43, 53 and 63 all have a predetermined resistance value between the source and the drain and thus change to an on state. Then, the ring oscillating unit 300 oscillates at a frequency corresponding to the control voltage. When the control voltage changes, the oscillation frequency of the ring oscillating unit 300 changes according to the change thereof.

On the other hand, when the control voltage of the control terminal $P_{in}$ becomes zero, namely, when the gates of the FETs 43, 53 and 63 are grounded, the FETs 43, 53 and 63 all change to an off state. Then, the sources of the FETs 42, 52 and 62 are all in a separated state from the ground, and thus the ring oscillating unit 300 stops its oscillation.

Considering here the case that the switch control unit 400 controls the switches 410 to 413 and the switches 420 to 423 to turn on, the control terminals $P_{in}$ of respective inverters change to a connection state with the frequency control terminal P via the common terminals and the NO terminals of the switches 410 and 420. In this case, the ring oscillating units 310 and 320 oscillate at a predetermined frequency. Also, by turning on the switches 411 to 413 and 421 to 423, the ring oscillating units 300 to 320 change to a parallel connection state. Then, the number of parallel connections of the ring oscillating units becomes 3, and the channel resistance becomes ⅓ as compared to the case of the single ring oscillating unit 300, so that the phase noise level improves by 4.7 dB.

On the other hand, considering the case that the switch control unit 400 controls the switches 410 to 413 and the switches 420 to 423 to turn off, the ring oscillating units 310 and 320 change to an oscillation stop state by turning off of the switches 410 and 420, and the ring oscillating units 310 and 320 change to a separated state from the parallel connection by turning off of the switches 411 to 413 and 421 to 423. Accordingly, the phase noise level becomes the same as in the case of the single ring oscillating unit 300. Then, by stopping operations of the ring oscillating units 310 and 320, power consumption of the entire oscillator 2 becomes ⅓ as compared to the case that all the ring oscillating units 300 to 320 are in an operating state.

As described above, the oscillator 2 in this embodiment, the switch control unit 400 controls the switches for controlling operating states of the ring oscillating units and the switches for controlling the parallel connection state of the ring oscillating units together, the accuracy of an oscillation signal and the power consumption of the entire VCO can be optimized. For example, it becomes possible that when the accuracy of an oscillation signal is required, the number of parallel connections is increased to give priority to the accuracy, and when the accuracy of an oscillation signal is not required, the number of parallel connections is lowered to a tolerable level to optimize the power consumption.

It should be noted that, although in this embodiment the n-channel FETs 43, 53, 63 are connected to the source side of the n-channel FETs 42, 52, 62 constituting the inverters to control oscillations of the ring oscillating units, it is not limited to this. Specifically, p-channel FETs may be connected to the source side of the p-channel FETs 41, 51, 61 constituting the inverters, respectively. Also, it may be a structure in which p-channel FETs and n-channel FETs are connected to the source side of the respective p-channel FETs and n-channel FETs constituting the inverters.

Next, referring to FIG. 5, a PLL oscillator according to the third embodiment of the present invention will be described in detail. A PLL oscillator 3 in this embodiment is constructed using the oscillator 2 according to the second embodiment of the present invention. Therefore, components in common with the second embodiment are designated the common reference symbols, and redundant descriptions are omitted.

Figure 5:
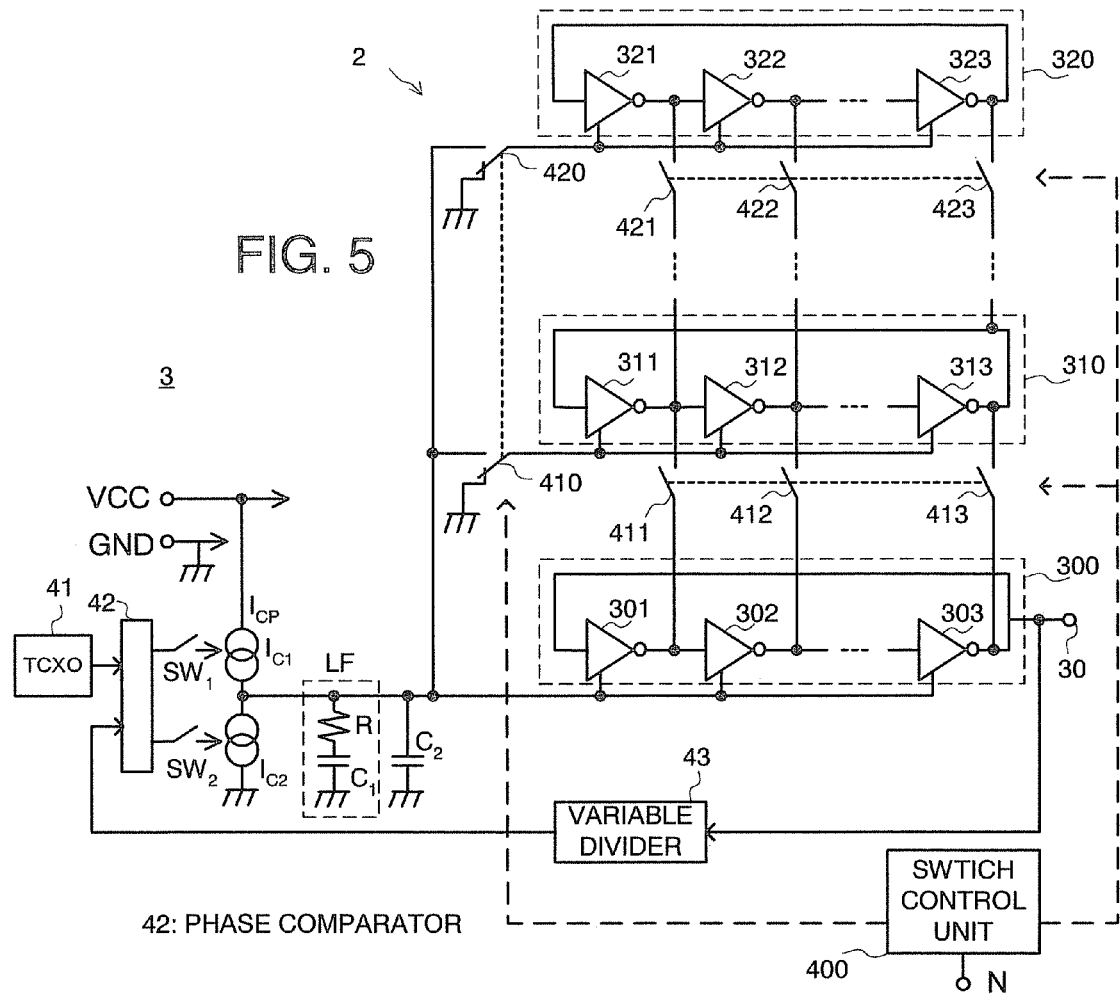
FIG. 5 is a block diagram showing the structure of a PLL oscillator according to a third embodiment of the present invention.

As shown in FIG. 5, the PLL oscillator 3 of this embodiment includes a reference signal oscillator (TCXO) 41, a phase comparator 42, switches $SW_1$ and $SW_2$, a charge pump $I_{CP}$, a loop filter LF, an oscillator 2 according to the second embodiment of the present invention, and a variable divider 43.

The TXCO1 is a reference signal oscillator which oscillates a signal having a frequency that is a reference in this PLL oscillator 3. The variable divider 43 is a dividing unit which divides and outputs an oscillation signal of the oscillator 2 by a predetermined dividing ratio based on an external signal.

The phase comparator 42 is a comparator which compares an oscillation output of the TCXO41 with an oscillation output of the oscillator 2 divided by the variable divider 43. The phase comparator 42 has a function to compare phases of two inputted oscillation outputs and output a pulse signal for controlling the switches $SW_1$, and $SW_2$ in a subsequent stage based on a comparison result. In the example shown in FIG. 5, the phase comparator 42 generates a pulse signal to turn on/off the switches $SW_1$ and $SW_2$ based on phase difference information (advance and delay, absolute amount) of the oscillation output of the TXCO 41 and the oscillation output of the oscillator 2 divided by the variable divider 43.

The switches $SW_1$ and $SW_2$ are current control switches to turn on/off two current sources $I_{C1}$ and $I_{C2}$ constituting the charge pump $I_{CP}$. The switches $SW_1$ and $SW_2$ control the charge pump $I_{CP}$ based on the pulse signal from the phase comparator 42.

The charge pump $I_{CP}$ includes two current sources $I_{C1}$ and $I_{C2}$ connected in series between power supply and ground and is a current generating unit which generates a control current based on the pulse signal sent from the phase comparator 42. The current source $I_{C1}$ is connected with its one end to the power supply and its other end to the current source $I_{C2}$ and the loop filter LF, and has a function to supply a current toward the loop filter LF. Further, the current source $I_{C2}$ is connected with its one end to the other end of the current source $I_{C1}$ and the loop filter LF and its other end to the ground, and has a function to suck out (function to draw) a current from the loop filter LF.

For example, when the phase of the oscillator 2 is in advance as a result of phase comparison by the phase comparator 42, the phase comparator 42 performs control to turn on the switch $SW_1$. Also, when the phase of the oscillator 2 is delayed, the phase comparator 42 performs control to turn on the switch $SW_2$. Specifically, when the switch $SW_1$ turns on the $I_{C1}$ operates and when the switch $SW_2$ turns on the $I_{C2}$ operates, and the charge pump $I_{CP}$ as a whole operates to allow flowing in or flowing out of the control current. As a result, the charge pump $I_{CP}$ acts to supply a positive or negative control current (supply or draw a control current) to the oscillator 2 based on the phase comparison result from the phase comparator 42.

The loop filter LF includes a resistor R and a capacitor $C_1$ which are connected in series, and is a low pass filter (LPF) which smoothes out the control current signal of the oscillator 2 to generate a control voltage signal of the oscillator 2. One end of the resistor R is connected to the output of the charge pump $I_{CP}$, and the other end thereof is connected to one end of the capacitor $C_1$. The other end of the capacitor $C_1$ is connected to the ground. The positive/negative control current supplied from the charge pump $I_{CP}$ is converted into a control voltage by the loop filter LF. The capacitor $C_2$ is connected in parallel to the loop filter LF, and acts to retain the control voltage converted by the loop filter LF and supply it to the oscillator 2 as a control voltage.

The oscillator 2 is an oscillator according to the second embodiment of the present invention, and the output terminal 20 of the oscillator 2 shown in FIG. 3 functions as an output terminal 30 of the PLL oscillator 3. The oscillation signal of the PLL oscillator 3 is inputted to the variable divider 43. Here, the control terminal $P_{in}$ of the ring oscillating unit 300 is connected constantly to the output of the loop filter LF, and the control terminals $P_{in}$ of the ring oscillating units 310 and 320 are connected to the output of the loop filter LF via the switches 410 and 420.

Next, the operation of the PLL oscillator 3 of this embodiment will be described. When an instruction signal to give the first priority to the accuracy of the PLL oscillator 3 is inputted to the accuracy instruction terminal N of the switch control unit 400, the switch control unit 400 performs control to turn on all the switches 410 to 413 and 420 to 423. In this case, the ring oscillating units 300 to 320 all change to an oscillating state, and all of them change to a parallel connection state. Respective oscillation signals of the ring oscillating units 300 to 320 synchronize, and an oscillation signal is outputted to the output terminal 30.

The oscillation signals outputted to the output terminal 30 are inputted to the variable divider 43 and divided by a predetermined dividing ratio This dividing ratio is determined based on the frequency of the TCXO that is the subject of comparison. The variable divider 43 inputs the divided oscillation signal to the phase comparator 42.

The phase comparator 42 compares the oscillation signal of the TCXO 41 with the oscillation signal divided in the variable divider 43, and based on a comparison result generates a pulse signal to control the switches $SW_1$ and $SW_2$. The switches $SW_1$ and $SW_2$ turn on/off based on the pulse signal and turn on/off the respective current sources $I_{C1}$ and $I_{C2}$ constituting the charge pump $I_{CP}$. Here, when the current source $I_{C1}$ is turned on, the control current flows from the current source $I_{C1}$ to the loop filter LF, and when the current source $I_{C2}$ is turned on, the control current flows from the loop filter LF to the current source $I_{C2}$. Accordingly, the positive/negative control current is supplied to the loop filter LF.

When the control current is supplied, the loop filter LF smoothes out the control current to generate a control voltage and applies it to the capacitor $C_2$. When the control voltage is applied to the capacitor $C_2$, the frequencies of the ring oscillating units 300 to 320 are controlled based on the control voltage. Thereafter, such a feedback loop operation is repeated to lock the frequency of the PLL oscillator 3.

Here, when an instruction signal indicating tolerable accuracy is inputted to the accuracy instruction terminal N of the switch control unit 400, the switch control unit 400 controls the switches 410 to 413 and 420 to 423 according to the accuracy indicated by the instruction signal. For examples when it controls to turn on only the switches 410 to 413 and controls to turn off the switches 420 to 423, the ring oscillating unit 320 is separated from the parallel connection, and the oscillation of the ring oscillating unit 320 is stopped. Therefore, as compared to the case of giving the first priority to the accuracy, the power consumption is decreased.

Similarly, in the case where further lower accuracy can be tolerated, when the switch control unit 400 controls to turn off all the switches 410 to 413 and 420 to 423, the ring oscillating units 410 and 420 are separated from the parallel connection and their oscillations are stopped. Therefore, the power consumption is further decreased.

Thus, since the PLL oscillator of this embodiment has the structure in which the ring oscillating units are connected in parallel, and the switch control unit controls the switches to discretionally separate the parallel connection and stops the oscillation of the separated ring oscillating unit, the power consumption can be optimized according to a required phase noise level.

Moreover, in the PLL oscillator of this embodiment, among the ring oscillating units included in the parallel connection structure, a predetermined number of ring oscillating units (only one, the ring oscillating unit 300, in the example shown in FIG. 5) are always incorporated in the loop of the PLL oscillator 3, the oscillation frequency does not change even when the switch control unit 400 changes the number of parallel connections of the ring oscillating units, which allows control of the phase noise level and the power consumption without deteriorating the stability of the loop.

Next, referring to FIG. 5 and FIG. 6, a radio apparatus according to a fourth embodiment of the present invention will be described in detail. A radio apparatus 4 of this embodiment is constructed using the PLL oscillator 3 according to the third embodiment of the present invention. Therefore, components in common with the third embodiment are designated the common reference symbols, and redundant descriptions are omitted.

Figure 6:
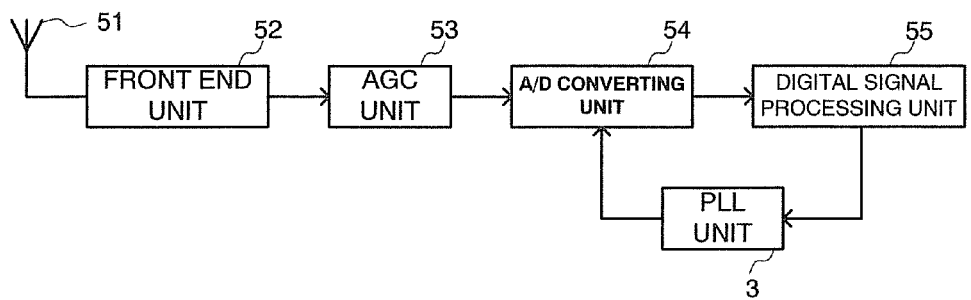
FIG. 6 is a block diagram showing the structure of a radio apparatus according to a fourth embodiment of the present invention.

As shown in FIG. 6, the radio apparatus 4 of this embodiment has an antenna 51, a front end unit 52, an AGC unit 53, an A/D converting unit 54, a digital signal processing unit 55 and a PLL unit 3 (PLL oscillator 3).

The antenna 51 is an aerial which receives a radio wave and retrieves a received signal. The front end unit 52 is an RF unit which amplifies the received signal retrieved by the antenna 51, and converts its frequency and turns it into a base band signal. The AGC unit 53 is an amplitude adjusting unit which aligns the amplitude of the base band signal which is varied due to a propagation path of the received signal. The A/D converting unit 54 is an A/D converter which converts the base band signal with a predetermined resolution into a digital signal.

The digital signal processing unit 55 is a signal processing unit which performs digital signal processing on the received signal which is converted into a digital signal and reproduces and outputs received data. The digital signal processing unit 55 can perform signal processing according to plural modification methods and also has a function to output an instruction signal instructing a resolution (accuracy) required by each modification method to the PLL unit 3.

The PLL unit 3 is an oscillator supplying a sampling clock signal to the A/D converting unit 54, and is constituted of the PLL oscillator 3 according to the third embodiment of the present invention. The PLL unit 3 controls the phase noise level of the sampling clock signal to be supplied according to the resolution of the A/D converting unit 54, thereby enabling optimization of the power consumption. Here, the instruction signal of resolution sent from the digital signal processing unit 55 is inputted to the accuracy instruction terminal N of the switch control unit 400, and the sampling clock signal is supplied from the output terminal 30 to the A/D converting unit 54.

Here, referring to FIG. 7 and FIG. 8, a relationship between the accuracy and the power consumption in the radio apparatus 4 according to this embodiment will be described in detail.

The radio apparatus 4 of this embodiment uses a method to switch a modulation method according to a propagation environment. Here, assuming that the radio apparatus 4 uses the BPSK method in an environment where many noises and interferences exist and uses the 16 QAM method in an environment where few noises and interferences exist, the resolution required for the A/D converting unit 54 is considered.

Generally, an SNR (Signal to Noise Ratio: SIN) minimally required to satisfy $10^{-3}$ BER (Bit Error Rate) is about 7 dB for the BPSK and about 17 dB for the 16 QAM. For example, it is considered that received signal power, noise power in the A/D converting unit 54, and noise power generated by a circuit block other than the A/D converting unit 54 such as interference are in a relationship shown in a table in FIG. 7.

During 16 QAM modulation, it is assumed that, in order to adapt the signal amplitude to the dynamic range of the A/D converting unit 54, the received signal is attenuated by 10 dB in the AGC unit 53. At this time, the noise power due to interference or the like is also attenuated by 10 dB, but the noise generated by the A/D converting unit 54 is not changed. Therefore, the SNR during the 16 QAM modulation deteriorates from 18 dB to 17.7 dB.

How far the noise power generated by the A/D converting unit 54 in the case of BPSK and the 16 QAM can be tolerated is shown in a table in FIG. 8. According to this, the BPSK can tolerate noise power of −4 dBm, and the 16 QAM can tolerate noise power of −14 dBm, and therefore, as compared to the 16 QAM, the BPSK can tolerate more noises generated by the A/D converting unit 54 by about 10 dB.

Generally, the resolution (the number of bits) n of an A/D converter is represented using SNR by the following equation.

$$N = \frac{SNR - 1.76}{6.02}$$ Equation 2

Thus, when the deterioration of SNR by the A/D converting unit 54 is tolerated by 10 dB, the resolution can be decreased by 1.3 bit. When the resolution required for the A/D converting unit 54 is lowered, it becomes possible to lower also the accuracy of a clock signal required for the PLL unit 3.

If the ring oscillating units are dominant noise sources among all the function blocks in the PLL unit 3, when the tolerable noise level is increased by 10 dB due to lowering of the resolution of the A/D converting unit 54, the phase noise level required for the ring oscillating units can be increased by 10 dB. Accordingly, in the apparatus 4 of this embodiment, when the modulation method switches from the 16 QAM to the BPSK, the digital signal processing unit 55 inputs to the PLL unit 3 an instruction signal to raise the tolerable noise level of the sampling clock signal for the A/D converting unit 54 by 10 dB. The PLL unit 3 receiving the instruction signal separates the number of loop oscillating units which correspond to the tolerable noise level by the amount of 10 dB from the parallel connection, and also stops oscillations of the loop oscillating units which are separated.

In this manner, when the modulation method in the radio apparatus 4 switches from the 16 QAM to the BPSK, the power consumption of the PLL unit 3 can be decreased to be about ¹⁄₁₀. Specifically, when the PLL unit 3 of the radio apparatus 4 of this embodiment consumes power of 10 mW to satisfy the SNR required for the 16 QAM, switching of the modulation method to the BPSK allows decreasing of the power consumption by 9 mW.

As has been described, the radio-apparatus in this embodiment, since the PLL oscillator according to the third embodiment of the present invention is used as a sampling clock signal oscillator for the A/D converter, the power consumption can be optimized according to a modification method.

It should be noted that the present invention is not limited to the above-described embodiments as they are, and in an implementation stage, it can be embodied by modifying components thereof within a range not departing from the spirit of the invention. Also, the plural components disclosed in the above-described embodiments can be appropriately combined to form various inventions. For example, some of all the components shown in the embodiments may be eliminated. Moreover, components from different embodiments may be combined appropriately.

What is claimed is:

1. An oscillator, comprising:
a plurality of oscillating units connected in parallel with each other; and
a control unit which controls number of parallel connections of said plurality of oscillating units based on an instruction signal indicating accuracy to be tolerated with respect to oscillation outputs of said oscillating units,
wherein said plurality of the oscillating units include:
a first loop oscillating unit formed by connecting a plurality of first inverters in series in multiple stages, the first loop oscillating unit outputting an oscillation signal; and
a second loop oscillating unit formed by connecting a plurality of second inverters in series in multiple stages, the second loop oscillating unit being connected in parallel with the first loop oscillating unit to improve the accuracy of the oscillation signal, and
wherein said control unit turns on/off connection between an output path of any one of the plurality of second inverters and an output path of the first inverter in a stage corresponding to the second inverter among the plurality of first inverters based on the instruction signal.

2. The oscillator according to claim 1,
wherein the inverter comprises a pair of field effect transistors (FETs).

3. The oscillator according to claim 1, further comprising an operation stop unit which stops an operation of the oscillating unit which is controlled to leave the parallel connections by said control unit.

4. A radio apparatus, comprising:
an A/D converter which A/D converts a received signal;
an oscillator according to claim 1; and
a signal processing unit which demodulates the A/D converted received signal and outputs the instruction signal to said oscillator according to a modulation method of the received signal,
wherein the oscillator supplies a clock signal to said A/D convertor.

5. The radio apparatus according to claim 4, further comprising:
an operation stop unit which stops an operation of the oscillating unit which is controlled to leave the parallel connections by the control unit.

6. The radio apparatus according to claim 5,
wherein the first and second inverters are configured to receive a control voltage for controlling a frequency of the oscillation signal, and
wherein said operation stop unit stops an oscillation of the second oscillating unit which is controlled to leave the parallel connections based on the instruction signal by stopping supply of the control voltage to the corresponding second inverters.

7. An oscillator, comprising:
a plurality of oscillating units connected in parallel with each other;
a control unit which controls number of parallel connections of said plurality of oscillating units based on an instruction signal indicating accuracy to be tolerated with respect to oscillation outputs of said oscillating units; and
an operation stop unit which stops an operation of the oscillating unit which is controlled to leave the parallel connections by said control unit,
wherein said plurality of oscillating units include:
a first loop oscillating unit formed by connecting a plurality of first inverters in series in multiple stages, the first loop oscillating unit outputting an oscillation signal; and a second loop oscillating unit formed by connecting a plurality of second inverters in series in multiple stages, the second loop oscillating unit being connected in parallel with the first loop oscillating unit to improve the accuracy of the oscillation signal, and wherein said control unit comprises:

a open/close control unit which controls opening/closing of the parallel connection of said plurality of oscillating units based on the instruction signal; and a plurality of switches which open/close connection between an output path of any one of the plurality of second inverters and an output path of the first inverter in a stage corresponding to the second inverter among the plurality of first inverters to control opening/closing of the parallel connection.

8. The oscillator according to claim 7, wherein the first and second inverters are configured to receive a control voltage for controlling a frequency of the oscillation signal, and wherein said operation stop unit stops an oscillation of the second oscillating unit which is controlled to leave the parallel connections based on the instruction signal by stopping supply of the control voltage to the corresponding second inverters.

9. A radio apparatus, comprising:

an A/D converter which A/D converts a received signal;

an oscillator according to claim 7; and a signal processing unit which demodulates the A/D converted received signal and outputs the instruction signal to said oscillator according to a modulation method of the received signal, wherein the oscillator supplies a clock signal to said A/D convertor.

10. A PLL oscillator, comprising:

a voltage controlled oscillator comprising a plurality of oscillating units connected in parallel with each other and a control unit which controls the number of parallel connections of the plurality of oscillating units based on an instruction signal indicating accuracy to be tolerated with respect to oscillation outputs of the oscillating units;

a reference signal oscillator;

a phase comparator which compares a phase of an output of said voltage controlled oscillator and a phase of an output of said reference signal oscillator; and a loop filter which generates based on a phase comparison result by said phase comparator a controlled voltage for controlling said voltage controlled oscillator, wherein the plurality of the oscillating units include:

a first loop oscillating unit formed by connecting a plurality of first inverters in series in multiple stages, the first loop oscillating unit outputting an oscillation signal; and a second loop oscillating unit formed by connecting a plurality of second inverters in series in multiple stages, the second loop oscillating unit being connected in parallel with the first loop oscillating unit to improve the accuracy of the oscillation signal, and wherein the control unit turns on/off connection between an output path of any one of the plurality of second inverters and an output path of the first inverter in a stage corresponding to the second inverter among the plurality of first inverters based on the instruction signal.

11. The PLL oscillator according to claim 10, further comprising:

an operation stop unit which stops an operation of the oscillating unit which is controlled to leave the parallel connections by the control unit.

12. The PLL oscillator according to claim 11, wherein the first and second inverters are configured to receive a control voltage for controlling a frequency of the oscillation signal, and wherein said operation stop unit stops an oscillation of the second oscillating unit which is controlled to leave the parallel connections based on the instruction signal by stopping supply of the control voltage to the corresponding second inverters.

13. A PLL oscillator, comprising:

a voltage controlled oscillator comprising a plurality of oscillating units connected in parallel with each other and a control unit which controls the number of parallel connections of the plurality of oscillating units based on an instruction signal indicating accuracy to be tolerated with respect to oscillation outputs of the oscillating units;

a reference signal oscillator;

a phase comparator which compares a phase of an output of said voltage controlled oscillator and a phase of an output of said reference signal oscillator;

a loop filter which generates based on a phase comparison result by said phase comparator a controlled voltage for controlling said voltage controlled oscillator; and an operation stop unit which stops an operation of the oscillating unit which is controlled to leave the parallel connections by the control unit, wherein the plurality of oscillating units comprise:

a first loop oscillating unit formed by connecting a plurality of first inverters in series in multiple stages, the first loop oscillating unit outputting an oscillation signal; and a second loop oscillating unit formed by connecting a plurality of second inverters in series in multiple stages, the second loop oscillating unit being connected in parallel with the first loop oscillating unit to improve the accuracy of the oscillation signal, and wherein the control unit comprises:

a open/close control unit which controls opening/closing of the parallel connection of said plurality of oscillating units based on the instruction signal; and a plurality of switches which opens/closes connection between an output path of any one of the plurality of second inverters and an output path of the first inverter in a stage corresponding to the second inverter among the plurality of first inverters to control open/closing of the parallel connection.

* * * * *